United States Patent
Dotson et al.

(10) Patent No.: US 8,103,989 B2
(45) Date of Patent: Jan. 24, 2012

(54) METHOD AND SYSTEM FOR CHANGING CIRCUITS IN AN INTEGRATED CIRCUIT

(75) Inventors: Nathan A. Dotson, Port Ewen, NY (US); Jonathan Y. Chen, Marlboro, NY (US); David L. Rude, Marlboro, NY (US); Vern A. Victoria, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 12/037,421

(22) Filed: Feb. 26, 2008

(65) Prior Publication Data

US 2009/0212819 A1   Aug. 27, 2009

(51) Int. Cl.
*G06F 17/50* (2006.01)
(52) U.S. Cl. ...................................... 716/100
(58) Field of Classification Search ............... 716/1, 100
See application file for complete search history.

(56) References Cited

U.S. PATENT DOCUMENTS

| | | | |
|---|---|---|---|
| 5,953,236 A | 9/1999 | Hossain et al. | |
| 6,014,506 A | 1/2000 | Hossain et al. | |
| 6,031,981 A | 2/2000 | Lee et al. | |
| 6,260,177 B1 | 7/2001 | Lee et al. | |
| 6,453,454 B1 | 9/2002 | Lee et al. | |
| 6,502,229 B2 | 12/2002 | Lee et al. | |
| 6,594,809 B2 | 7/2003 | Wang et al. | |
| 6,668,358 B2 | 12/2003 | Friend et al. | |
| 6,922,817 B2 | 7/2005 | Bradfield et al. | |
| 6,981,231 B2 | 12/2005 | Xie et al. | |
| 7,137,094 B2 | 11/2006 | Tien | |
| 7,231,626 B2 | 6/2007 | Hoff et al. | |
| 7,330,808 B1 * | 2/2008 | Jorgensen et al. | 703/14 |
| 7,685,550 B2 * | 3/2010 | Siegler et al. | 716/119 |
| 2003/0070147 A1 * | 4/2003 | Friend et al. | 716/2 |
| 2004/0196684 A1 * | 10/2004 | Katoh et al. | 365/149 |
| 2004/0230924 A1 * | 11/2004 | Williams et al. | 716/2 |
| 2006/0031796 A1 | 2/2006 | Meaney | |
| 2008/0040698 A1 * | 2/2008 | Ferrari et al. | 716/6 |

OTHER PUBLICATIONS

"IBM® z/Architecture Principles of Operation", Publication No. SA22-7832-05, 6th Edition, Apr. 2007. 1,215 pages separated into 4 electronic attachments.

* cited by examiner

*Primary Examiner* — Suchin Parihar
(74) *Attorney, Agent, or Firm* — Cantor Colburn LLP; William A. Kinnaman, Jr.

(57) ABSTRACT

A method for modifying an integrated circuit and integrated circuits are provided. The method includes: providing an integrated circuit design comprising a plurality of circuit books having a first threshold voltage; and replacing at least one of the plurality of circuit books with at least one gate array book having a second threshold voltage that is lower than the first threshold voltage.

9 Claims, 4 Drawing Sheets

US 8,103,989 B2

METHOD AND SYSTEM FOR CHANGING CIRCUITS IN AN INTEGRATED CIRCUIT

BACKGROUND OF THE INVENTION

This invention relates generally to designing electrical circuits, and more particularly to providing systems and methods for swapping circuits in an engineering change metal-only (ECO) process.

The use of gate array cells is a technology used to place large numbers of logic circuits on single or integrated chips. Each gate array cell includes rows of transistors, and multiple gate array cells may be arranged on the surface of the chip. One or more gate array cells may be grouped together in a "gate array book" to form a logic device, i.e., "logic gate", such as AND, NAND, OR or NOR gates. Each gate array book is provided to perform a specific logic function in an integrated circuit.

Circuit ECO processes are provided to fix or modify prior integrated circuit, i.e. "chip", designs, and are generally implemented with the use of gate array filler cells, particularly late in the development cycle. These approaches seek to minimize the risk involved with changing circuits in the chip. Traditionally, in non-critical paths, devices with a higher gate threshold voltage (Vt), such as Complementary metal-oxide-semiconductor (CMOS) devices, are used to reduce the power dissipated, both in active and in non-active devices.

In typical designs, the Vt levels for gate array filler cells match the standard cells/circuit books used in the chip. However, situations can arise in circuit design where there are design changes, particularly changes that occur late in the design process. Such changes include design re-maps, introduction of new timing constraints to existing logic, and additional margin needs introduced to the design to minimize risk on logic paths.

Current technologies for swapping circuits focus heavily on swapping of existing logic gates in timing closure processes. Other standard solutions in place to address ECO swapping issues include redesigning circuits physically or logically to meet new or future restrictions, and remapping a design to new technology. All of these approaches can significantly impact the schedule of a design project and/or have significant cost implications to integrated circuit generation process, including front-end-of-line (FEOL) and back-end-of-line (BEOL) ECOs, and BEOL metal-only ECOs.

It would be desirable/advantageous to be able to provide a method and device to alter fully functional and fully-developed circuits by providing the best possible filler cell to meet functional and frequency requirements, without introducing significant delay or impacting a design process.

BRIEF SUMMARY OF THE INVENTION

An exemplary embodiment includes a method for modifying an integrated circuit. The method includes: providing an integrated circuit design comprising a plurality of circuit books having a first threshold voltage; and replacing at least one of the plurality of circuit books with at least one gate array book having a second threshold voltage that is lower than the first threshold voltage.

Another exemplary embodiment includes an integrated circuit including: at least one circuit book having a first threshold voltage; and at least one gate array book having a second threshold voltage, wherein the second threshold voltage is lower than the first threshold voltage.

A further exemplary embodiment includes an integrated circuit including a gate array filler book region, the filler book region comprising at least a first region and a second region. The first region includes at least one first filler book having a first threshold voltage, the second region comprises at least one second filler book having a second threshold voltage, and the first threshold voltage is different than the second threshold voltage.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

There is provided a method for replacing gate array books or other previously existing logic books in an integrated circuit, and associated integrated circuit (IC) designs, that speeds up circuits by replacing previously existing gate array books or other previously existing logic books, referred to herein simply as "books", with gate array logic books having a lower threshold voltage than the previously existing books. The method includes replacing one or more of the previously existing books with one or more alternate threshold voltage (Vt) gate array logic books. The IC designs may include an integrated circuit having at least one circuit book, such as a gate array book, and at least one filler book having a lower Vt than the circuit book. The IC designs may include multiple threshold gate array regions, and may include filler regions having multiple threshold voltages.

Figure 1:
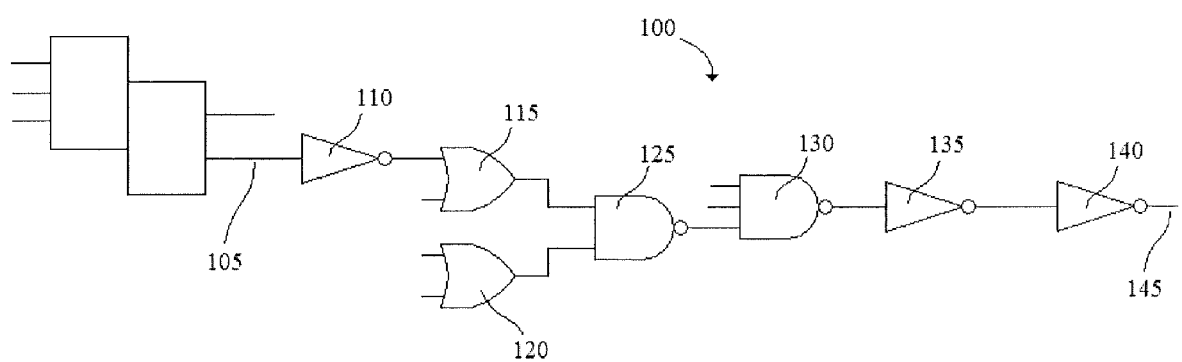
FIG. 1 illustrates a prior art logic circuit design.

Referring to FIG. 1, there is provided an example of a prior art logic circuit design 100, including a plurality of logic gates. Each logic gate may be created by a respective gate array cell or book. The design 100 shows an example of a circuit prior to any applied ECO processes.

The circuit design 100 includes an input pin 105, logic gates 110, 115, 120, 125, 130, 135 and 140, and an output pin 145. In this embodiment, logic gates 110, 135 and 140 are inverters (also referred to as "NOT" gates), gates 115 and 120 are "OR" gates, and gates 125 and 130 are "NAND" gates. Although the exemplary embodiment includes a specific layout of logic gates, the design may include any number or types of logic gates.

In this embodiment, the input pin 105 is connected to the inverter 110, whose output is connected to the OR gate 115. The outputs of the OR gates 115 and 120 are connected to an input of the NAND gate 125, whose output is connected to the NAND gate 130. The output of the NAND gate 130 is connected to the input of the inverter 135, whose output is connected to the input of the inverter 140. The inverter 140 is in turn connected to the output pin 145. In one embodiment, the inverters 135 and 140 may form a double inverter, i.e., a buffer.

Each of the logic gates 110, 115, 120, 125, 130, 135 and 140 have an associated first threshold voltage. In this embodiment, the first threshold voltage is the same for each logic gate 110, 115, 120, 125, 130, 135 and 140.

Figure 2:
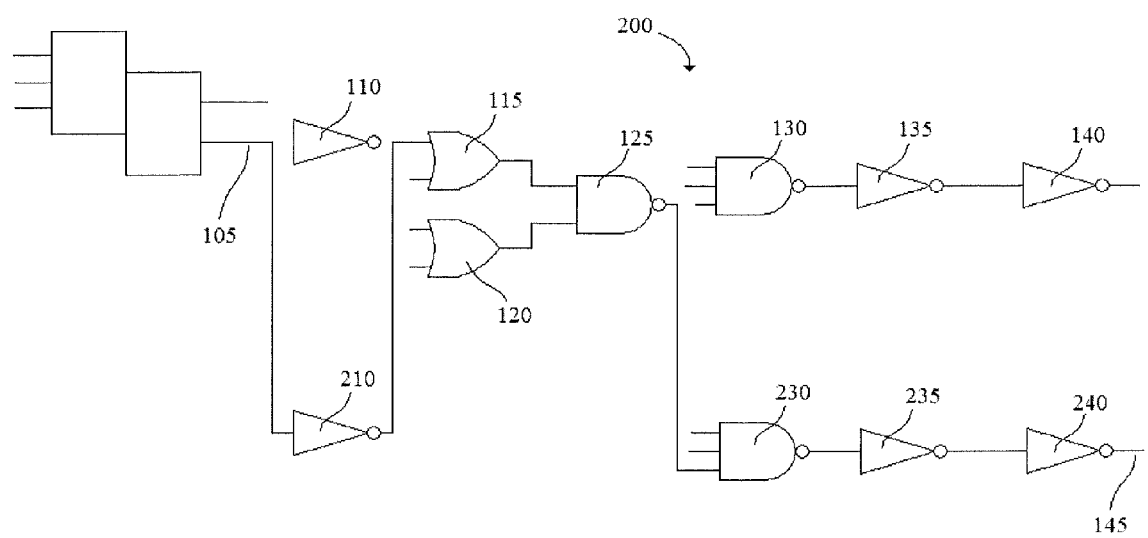
FIG. 2 illustrates a revised logic circuit design according to methods described herein.

Referring to FIG. 2, there is provided an example of a modified design 200 performed in conjunction with a method described herein for replacing circuit books with gate array books, such as via a ECO process. In one embodiment, the modified design 200 is accomplished via a metal only ECO process.

The modified design 200 includes a low threshold inverter 210, a low threshold NAND gate 230, and low threshold inverters 235 and 240. In this embodiment, the input pin 105 is connected to the low threshold inverter 210, whose output is connected to an input of the OR gate 115. The output of the NAND gate 125 is now connected to an input of the lower threshold NAND gate 230.

In essence the modified design 200 represents a replacement of logic gates 110, 130, 135 and 140 with low threshold logic gates 210, 230, 235 and 240. Each of the low threshold logic gates 210, 230, 235 and 240 have a second threshold voltage.

Thus, there is provided a method for replacing circuit books or gate array books in an integrated circuit. The integrated circuit includes a plurality of circuit books that make up logic gates. The method includes determining which of the circuit books to replace, and then replacing each selected circuit book with a chosen gate array book, e.g., a metal only gate array book, having a threshold voltage that is different than the threshold voltage of the selected circuit book.

In one embodiment, if a relatively large gate (i.e., a gate having a large CMOS gate width) is to be swapped out, a plurality of gate array cells, e.g., 2 to 3 cells, may be arranged in parallel. For example, a plurality of gate array cells may be arranged in parallel and replace the inverter 140 that drives the output pin 145.

The method described herein, in one embodiment, and shown for example in FIG. 2, provides for replacing selected circuit books with replacement or gate array books that have identical logic as the selected circuit books and lower Vt that the circuit books.

In one embodiment, the filler books described herein do not dissipate any more power than the selected circuit books having a normally-used Vt, unless they are enabled for ECO, because the CMOS gates of these idle filler books are tied to have zero bias voltages.

In another embodiment, the method includes any of various macro floor planning techniques to ensure proper spacing between circuit books and filler books to allow for a thorough distribution of gate array filler books to minimize the impact to circuit designs.

Figure 3:
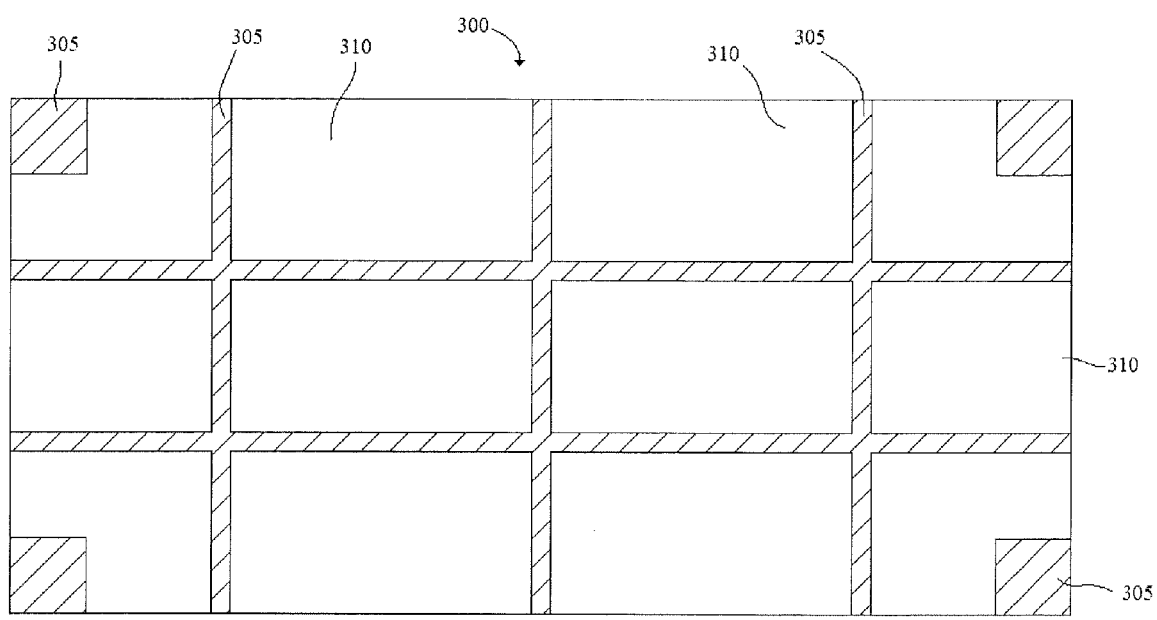
FIG. 3 illustrates a filler book macro-array region of an integrated circuit.

Referring to FIG. 3, there is provided a filler gate macro-array region 300 that forms at least a portion of an integrated circuit area. An associated integrated circuit may have any number of macro-array regions 300. The macro-array 300 includes a higher oxide gate array filler region 305, which has a relatively high voltage threshold. The macro-array 300 also includes a lower oxide gate array 310, which has a relatively low voltage threshold. The macro-array, as described herein, includes multiple threshold gate array regions, e.g., regions 305 and 310, to protect different timing requirements at various corners or areas of the integrated circuit design.

Providing the macro-array region 300 with differing regions 305 and 310, having alternate threshold voltages, allows the cell design to cover bases for all timing corners. The pattern for filler cells and regions shown in FIG. 3 is merely exemplary. Any number, shape or configuration of regions may be used based on a designer's requirements. In addition, the gate array filler regions may be incorporated in conjunction with one or more other regions, such as regions including originally designed circuit gate arrays, or "circuit regions".

In one embodiment, the filler regions, such as regions 305 and 310, are filled by a specified gate array filler type after all standard books are placed.

Figure 4:
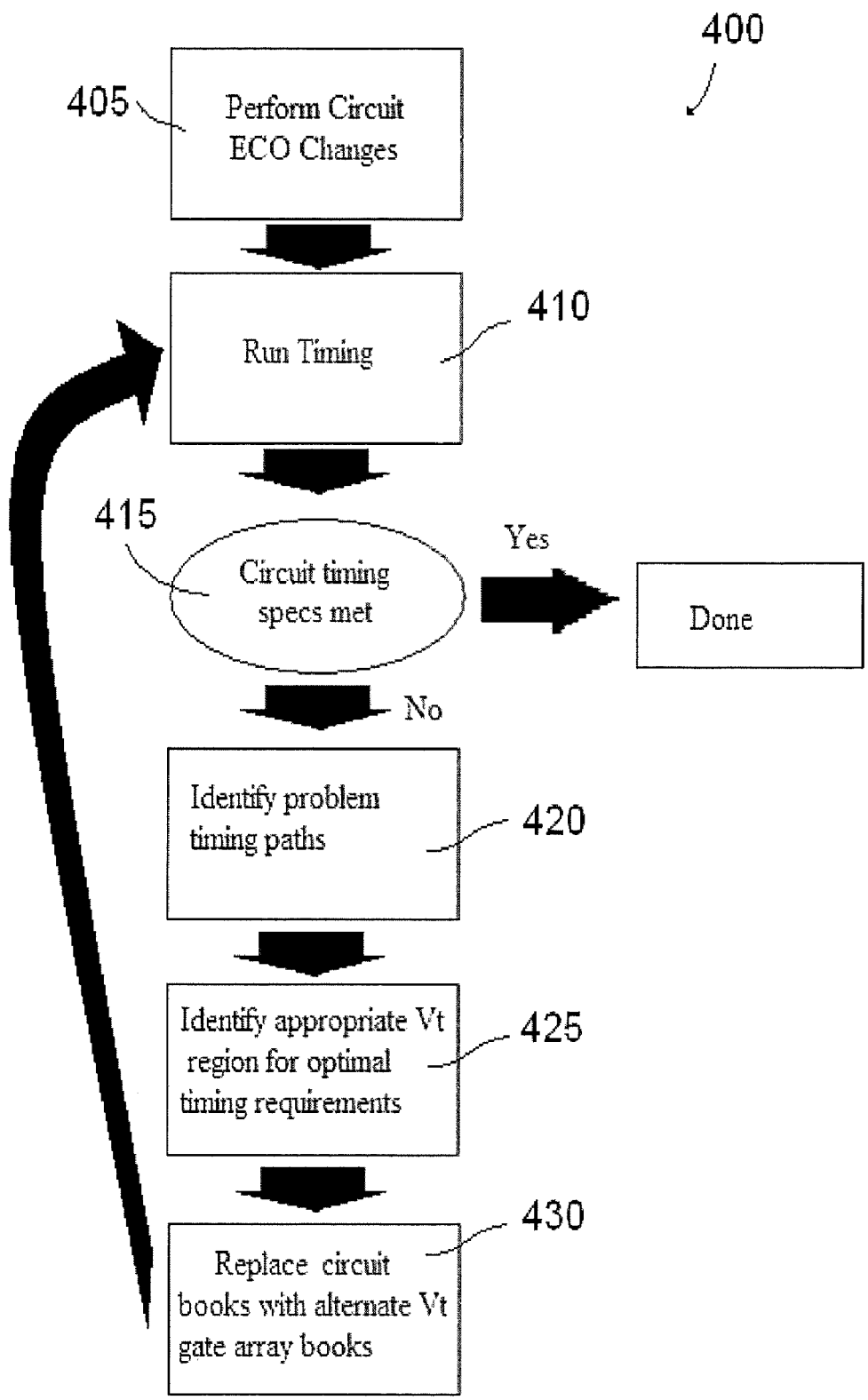
FIG. 4 illustrates an exemplary embodiment of a method for replacing circuit books or gate array books in an integrated circuit.

Referring to FIG. 4, there is provided an embodiment of a method 400 for replacing circuit books or gate array books in an integrated circuit. The method 400 includes one or more stages 405, 410, 415, 420, 425 and 430. The method 400 may be performed in conjunction with any suitable integrated circuits such as those described herein, processors and other components.

In the first stage 405, a circuit change is performed on an integrated circuit via an ECO process. In one embodiment, gate array regions having alternate threshold voltages, as described in FIG. 3, are present in the integrated circuit.

In this example, any suitable circuits or logic gates may be replaced with metal only gate array logic gates based on a requested design change, to produce a modified design. In one embodiment, the gate array logic books have threshold voltages that are at least substantially equal to the threshold voltages of the pre-existing circuit books.

In the second stage 410, a timing test is performed on the modified design. The timing test includes checking that the modified design is fully legalized and that there are no timing violations, i.e., that the circuit timing specifications are met. The timing test may be performed by any known methods, for example, gate simulation methods.

In the third stage 415, if the circuit timing specifications are met, the method 400 is complete. Alternatively, if the timing specifications are not met by the modified design, the method 400 proceeds to stage 420.

In the fourth stage 420, problem timing paths may be identified. In one embodiment, as a result of the timing test performed, the added gate array circuit books or preexisting logic gates in a path that produce timing violations are identified.

In the fifth stage 425, appropriate gate array regions, i.e., alternate Vt regions, are identified that would result in correction of the timing violation or otherwise provide improved or optimal timing based on the timing requirements of the circuit. This may be accomplished by performing various simulations of the circuit with simulated replacement, alternate Vt filler books (i.e., alternate Vt gate array books), to determine the optimum timing characteristics of the modified circuit.

In one embodiment, the alternate Vt region may be one or more Vt regions having a threshold voltage that is different than the threshold voltage of the circuit books. In another embodiment, the alternate Vt region(s) may have a threshold voltage or voltages that are less than the threshold voltage of the circuit books. In yet another embodiment, the alternate Vt region may include a plurality of regions having one or more different threshold voltages that are different than the threshold voltage of the circuit books.

In the sixth stage 430, after appropriate alternate Vt filler regions are identified, selected circuit books in the appropriate Vt region(s) are replaced with alternate Vt gate array logic books having desired threshold voltages.

After the alternate Vt gate array logic books are installed, further timing tests may be performed on the design. If there are no timing violations, then the method 400 is complete.

If the timing test or tests are not successful, then stages 420-430 are repeated until a valid design is achieved.

Technical effects and benefits include the increased speed of circuits provided by replacing one or more existing books with lower Vt gate array logic books, particularly in a metal only ECO process.

In addition, multiple threshold gate array filler regions, other than the fastest available type, can be planned into the design to cover cases where timing requirements must be protected at various corners of the design. The methods described herein provide such advantages not realized in prior art solutions, and are less intrusive and pose a lower risk to the stability of the design than do prior art solutions.

As described above, embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for modifying an integrated circuit, the method comprising:

providing, by a computer, a gate array region including at least one circuit book having a first threshold voltage; and providing, by the computer, a gate array filler book region including at least one filler book and configured to replace the at least one circuit book with a gate array book, the filler book region comprising at least a first region and a second region, wherein the first region comprises at least one first filler book having no pre-selected logical function and having a second threshold voltage, the second region comprises at least one second filler book having no pre-selected logical function and having a third threshold voltage, the first threshold voltage is different than the second threshold voltage, and the third threshold voltage is different than the first threshold voltage and the second threshold voltage.

2. The method of claim 1, wherein the method is a metal-only engineering change.

3. The method of claim 1, wherein the at least one circuit books forms a logical gate.

4. The method of claim 1, wherein the gate array book is a metal-only gate array book.

5. The method of claim 1, wherein the gate array book is a plurality of gate array books connected in parallel.

6. An integrated circuit comprising:

a gate array region including at least one circuit book having a first threshold voltage;

a gate array filler book region including at least one filler book and configured to replace the at least one circuit book with a gate array book, the filler book region comprising at least a first region and a second region, wherein the first region comprises at least one first filler book having no pre-selected logical function and having a second threshold voltage, the second region comprises at least one second filler book having no pre-selected logical function and having a third threshold voltage, the first threshold voltage is different than the second threshold voltage, and the third threshold voltage is different than the first threshold voltage and the second threshold voltage.

7. The integrated circuit of claim 6, wherein the at least one first and second filler books each become a logical gate.

8. The integrated circuit of claim 6, wherein the at least one first and second filler books are gate array books.

9. The integrated circuit of claim 6, wherein the at least one first and second filler books are metal-only filler books.

* * * * *